US007295026B2

(12) United States Patent
Van Berkel et al.

(10) Patent No.: US 7,295,026 B2
(45) Date of Patent: Nov. 13, 2007

(54) AUTOMATED POSITION CONTROL OF A SURFACE ARRAY RELATIVE TO A LIQUID MICROJUNCTION SURFACE SAMPLER

(75) Inventors: Gary J. Van Berkel, Clinton, TN (US); Vilmos Kertesz, Knoxville, TN (US); Michael James Ford, Little Rock, AR (US)

(73) Assignee: UT-Battelle, LLC, Oak Ridge, TN (US)

( * ) Notice: Subject to any disclaimer, the term of this patent is extended or adjusted under 35 U.S.C. 154(b) by 249 days.

(21) Appl. No.: 11/144,882

(22) Filed: Jun. 3, 2005

(65) Prior Publication Data

US 2006/0273808 A1 Dec. 7, 2006

(51) Int. Cl.
*G01R 31/02* (2006.01)

(52) U.S. Cl. ..................................................... 324/758

(58) Field of Classification Search ........ 324/756-758; 250/491.1, 557, 559.31, 201.3, 234, 306, 250/309; 382/145-151; 356/399, 318; 73/105

See application file for complete search history.

(56) References Cited

U.S. PATENT DOCUMENTS

| | | | | |
|---|---|---|---|---|
| 5,081,353 | A * | 1/1992 | Yamada et al. | 250/306 |
| 5,200,603 | A * | 4/1993 | Hackenberg et al. | 250/201.9 |
| 6,803,566 | B2 | 10/2004 | Van Berkel | 250/288 |
| 2003/0193020 | A1* | 10/2003 | Van Berkel | 250/288 |
| 2006/0284084 | A1* | 12/2006 | Morimoto et al. | 250/309 |

* cited by examiner

*Primary Examiner*—Ha Tran Nguyen
*Assistant Examiner*—Roberto Velez
(74) *Attorney, Agent, or Firm*—Michael E. McKee

(57) ABSTRACT

A system and method utilizes an image analysis approach for controlling the probe-to-surface distance of a liquid junction-based surface sampling system for use with mass spectrometric detection. Such an approach enables a hands-free formation of the liquid microjunction used to sample solution composition from the surface and for re-optimization, as necessary, of the microjunction thickness during a surface scan to achieve a fully automated surface sampling system.

18 Claims, 6 Drawing Sheets

FIG. 6c
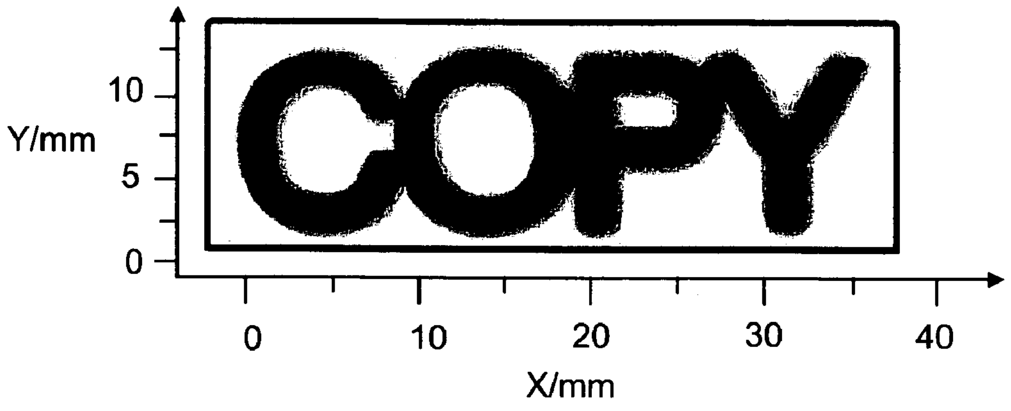
FIG. 6d
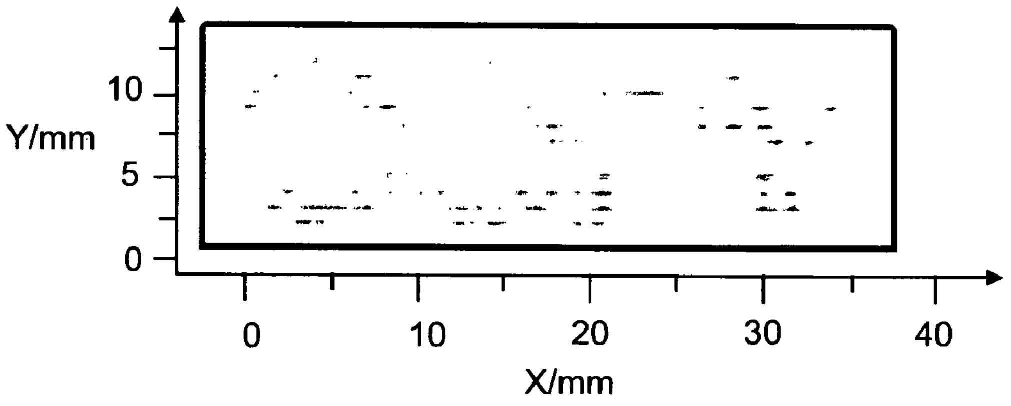
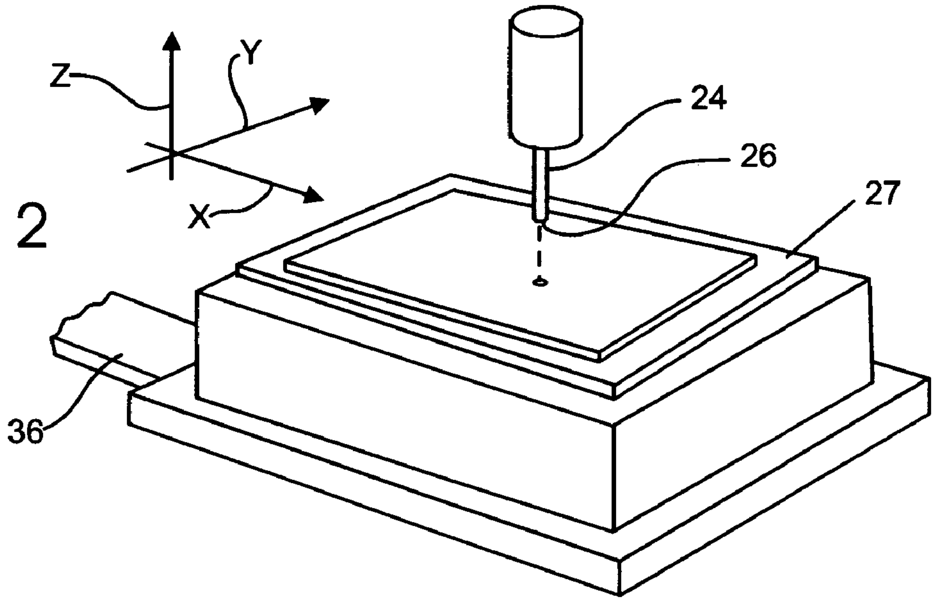
FIG. 2

AUTOMATED POSITION CONTROL OF A SURFACE ARRAY RELATIVE TO A LIQUID MICROJUNCTION SURFACE SAMPLER

This invention was made with Government support under Contract No. DE-AC05-00OR22725 awarded by the U.S. Department of Energy to UT-Battelle, LLC, and the Government has certain rights to the invention.

BACKGROUND OF THE INVENTION

This invention relates generally to sampling means and methods and relates, more particularly, to the means and methods for sampling surface array spots having analytes.

In earlier U.S. Pat. No. 6,803,566, having the same assignee as the instant application, a sampling technique is disclosed which involves the sampling of surface array spots having analytes. More specifically, the described sampling technique utilizes a tipped probe and an associated self-aspirating emitter through which a liquid agent, such as a eluting solvent, is delivered to the surface array and through which samples are conducted from the surface array for purposes of analysis. In addition, a positioning system is provided for automatically translating the surface array along X and Y-coordinate axes (i.e. within the plane of the surface array) to alter the position of the surface array relative to the probe. In other words, by shifting the surface array relative to the probe along X and Y coordinate directions, the tip of the probe can be positioned in registry with any spot (i.e. any X-Y coordinate location) along the surface array. Thereafter, the surface array and tip of the probe can be manually moved toward one another (i.e. along the Z-coordinate axis) until a liquid microjunction is presented between the tip of the probe and the surface array, and it is in this probe-to-surface array condition that the corresponding spot on the array is sampled with the probe. The sample is thereafter conducted to appropriate test equipment where the desired analysis of the sample is carried out. The probe used in such a sampling technique is particularly well-suited as an interface for coupling thin-layer chromatography and mass spectrometry. The referenced patent describes the sampling technique as being useful in the field of proteomics in which protein microarrays are analyzed, but other uses can be had.

Heretofore and as suggested above, the spaced relationship between the tip of the probe and surface array (i.e. along the Z-coordinate axis) to effect the initial formation of the liquid microjunction and to thereafter maintain an optimum microjunction thickness during the course of an experiment has required the intervention of an operator. In other words, it is an operator who has been required to manually position the tip of the probe and the surface array adjacent one another for sampling purposes and to make manual adjustments, as necessary, of the probe-to-surface array distance throughout the course of the sampling procedure. Furthermore, the collection of a plurality of samples from different spots or alternative development lanes (e.g. along an X or Y-coordinate path) upon the surface array is likely to involve additional operator-controlled, i.e. manual, adjustment, of the distance between the tip of the probe and the surface array. Consequently and as a result of the necessary involvement of an operator during the control of the probe-to-surface array distance during a sampling technique of the prior art, the precision of this prior art sample-collection technique typically corresponds to the skill of the operator involved.

It would be desirable to provide the aforedescribed sampling technique with a means for automatically controlling the probe-to-surface array distance during the collection of samples from surface array spots or development lanes.

Accordingly, it is an object of the present invention to provide a new and improved system and method for automatically controlling the distance between the sampling probe and the surface of the array to be sampled with the probe which does not require operator intervention during a sample-collecting operation.

Another object of the present invention is to provide such a system and method wherein the probe and surface array are automatically positioned in a desirable spaced relationship for purposes of sampling the surface array with the probe.

Still another object of the present invention is to provide such a system and method wherein the probe-to-surface distance is continually monitored throughout the sampling procedure and adjusted, as necessary, so that the probe-to-surface distance is maintained at an optimal spacing.

Yet another object of the present invention is to provide such a system which is uncomplicated in structure, yet effective in operation.

SUMMARY OF THE INVENTION

This invention resides in a sampling system and method for obtaining samples containing an analyte from a surface array.

The system of the invention includes a sampling probe having a tip and which is adapted to sample a surface array for analysis when disposed at a desired spaced target distance from the surface array so that an optimum liquid microjunction is presented between the tip of the sampling probe and the surface array. The system further includes means for moving the sampling probe and the surface array toward and away from one another and means for capturing an image of both the tip of the probe and the surface array and for generating signals which correspond to the captured image. In addition, means are included within the system for receiving the signals which correspond to the captured image and for determining the actual distance between the tip of the probe and the surface array from the captured image. Comparison means then compare the actual distance between the tip of the probe and the surface array to the desired target distance and initiates movement of the surface array and the probe tip toward or away from one another when the difference between the actual distance between the tip of the probe and the surface array and the desired target distance is outside of a predetermined range so that by moving the surface array and the probe tip toward or away from one another, the actual distance approaches the desired target distance.

The method of the invention includes the steps carried out by the system of the invention. In particular, such steps includes the capturing of an image of both the tip of the probe and the surface array and determining the actual distance between the tip of the probe and the surface array from the captured image. The actual distance between the tip of the probe and the surface array is then compared with the desired target distance at which the optimum liquid microjunction is presented between the probe tip and the surface array for sample-collecting purposes, and the surface array and the probe tip are subsequently moved toward or away from one another when the actual distance between the tip of the probe and the surface array and the desired target distance is outside of a predetermined range so that by moving the surface array and the probe tip toward or away from one another, the actual distance approaches the desired target distance.

BRIEF DESCRIPTION OF THE DRAWINGS

FIG. 2 is a perspective view of a fragment of the FIG. 1 system drawn to a slightly larger scale.

FIGS. 6*b*-6*d* are views of the word "COPY" which have been imaged onto pieces of paper from the image of FIG. 6*a*.

DETAILED DESCRIPTION OF AN ILLUSTRATIVE EMBODIMENT

Figure 1:
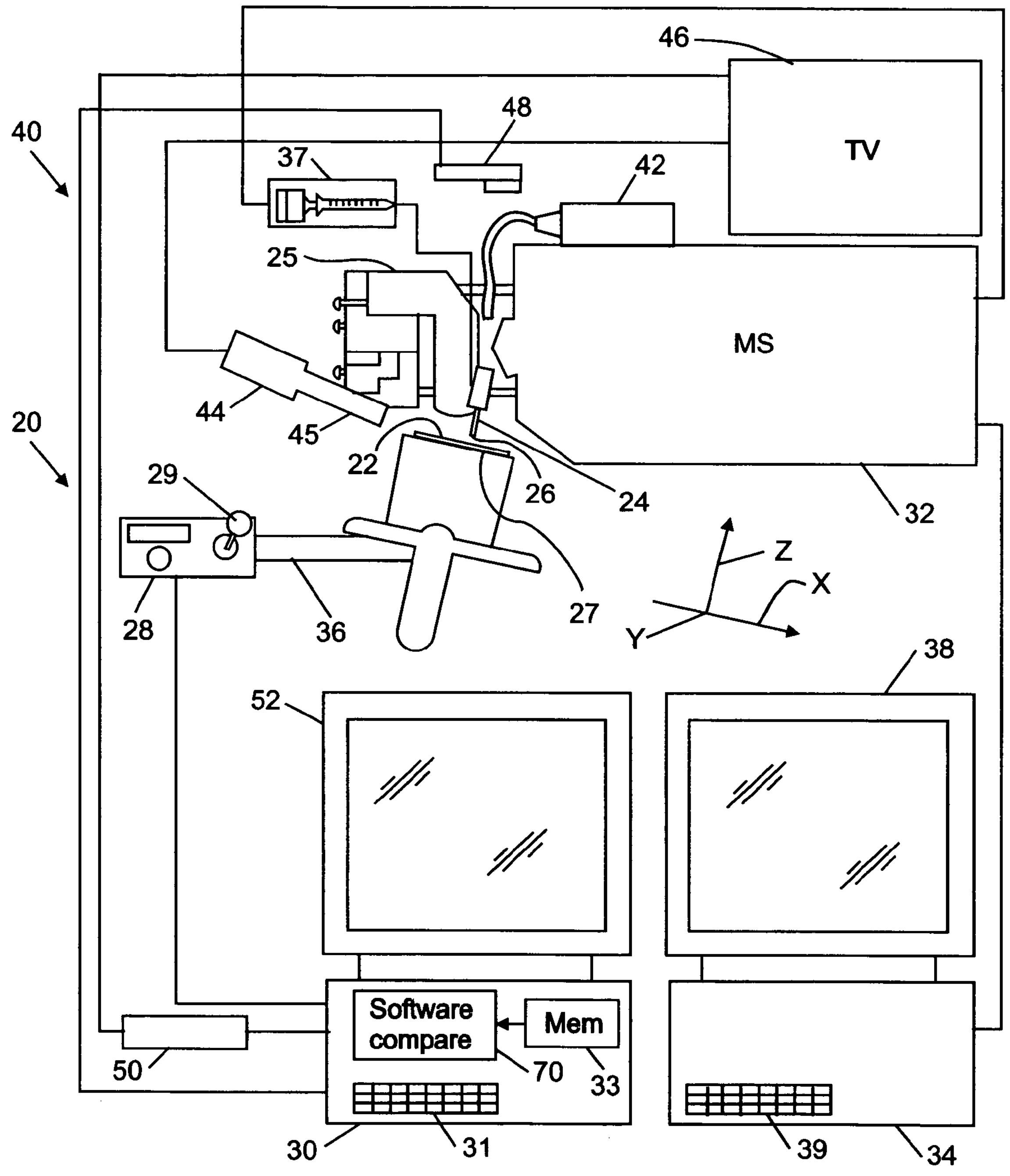
FIG. 1 is a schematic view of the system 20 within with features of the present invention are incorporated.

Turning now to the drawings in greater detail and considering first FIG. 1, there is schematically illustrated an embodiment, generally indicated 20, of a surface sampling electrospray system within which features of the present invention are embodied for purposes of obtaining samples from at least one spot of a surface array 22 for subsequent analysis. Although the surface array 22 can, for example, be a protein microarray whose samples are desired to be analyzed with a mass spectrometer 32, the system 20 can be used to sample any of a number of surfaces of interest. Accordingly, the principles of the invention can be variously applied.

The system 20 includes a sampling probe 24 (and an associated self-aspirating emitter 25) having a pair of concentric (i.e. inner and outer) tubes which terminate at a tip 26 which is positionable adjacent the surface array 22. During a sampling process, a predetermined liquid (e.g. an eluting solvent) is directed from a syringe pump 37 and onto the surface array 22 through the outer tube of the probe 24, and a desired sample is conducted, along with the predetermined liquid, away from the remainder of the surface array 22 through the inner tube of the probe 24 for purposes of analyzing the collected sample. For a more complete description of the sampling probe 24 and the method by which samples are collected thereby for the purpose of subsequent analysis, reference can be had to U.S. Pat. No. 6,803,566, the disclosure of which is incorporated herein by reference and which has the same assignee as the instant application.

With reference to FIGS. 1 and 2 and to enable samples to be collected from any spot along the surface of the array 22, the probe 24, along with its tip 26, is supported in a fixed, stationary condition, and the surface array 22 is supported upon a support plate 27 for movement relative to the probe 22 along the indicated X-Y coordinate axes, i.e. within the plane of the support plate 27, and toward and away from the tip 26 of the probe 24 along the indicated Z-coordinate axis. The support plate 27 of the depicted system can take the form, for example, of a thin-layer chromatography (TLC) plate upon which an amount of material desired to be analyzed is positioned. It follows that for purposes of discussion herein, the surface array 22 is supported by the support plate 27 within an X-Y plane, and the Z-axis (which substantially corresponds to the longitudinal axis of the probe 24) is perpendicular to the X-Y plane.

The support plate 27 is, in turn, supportedly mounted upon the movable support arm 36 of an XYZ stage 28 (FIG. 1), such as is available under the designation MS2000 XYZ stage from Applied Scientific Instrumentation, Inc. of Eugene, Oreg., for movement of the support plate 27, and the surface array 22 supported thereby, along the indicated X, Y and Z coordinate directions. The XYZ stage 28 is appropriately wired to a joystick control unit 29 which is, in turn, connected to a first control computer (in the form of a laptop computer 30) for receiving command signals therefrom so that during a sampling process performed with the system 20, samples can be taken from any desired spot (i.e. any desired X-Y coordinate location) along the surface array 22 or along any desired lane (i.e. along an X or Y-coordinate path) across the array 22 as the array 22 is moved within the X-Y plane beneath the probe tip 26. The characteristics of such relative movements of the surface array 22 and the probe 24, such as the sweep speeds and the identity of the X-Y locations at which the probe 24 is desired to be positioned in registry with the surface array 22 can be input into the computer 30, for example, by way of a computer keyboard 31 or pre-programmed within the memory 33 of the computer 30.

Although a description of the internal components of the XYZ stage 28 is not believed to be necessary, suffice it to say that the X and Y-coordinate position of the support surface 27 (and surface array 22) relative to the probe tip 26 is controlled through the appropriate actuation of, for example, a pair of reversible servomotors (not shown) mounted internally of the XYZ stage 28, while the Z-coordinate position of the support surface 27 (and surface array 22) relative to the probe tip 26 is controlled through the appropriate actuation of, for example, a reversible stepping motor (not shown) mounted internally of the XYZ stage 28. Therefore, by appropriately energizing the X and Y-coordinate servomotors, the array 22 can be positioned so that the tip 26 of the probe 24 can be positioned in registry with any spot within the X-Y coordinate plane of the array 22, and by appropriately energizing the Z-axis stepping motor, the array 22 can be moved toward or away from the probe tip 24.

With reference still to FIG. 1, the system 20 further includes a mass spectrometer 32 which is connected to the sampling probe 24 for accepting samples conducted thereto from the probe 24 for purposes of analysis, and there is associated with the mass spectrometer 32 a second control computer (in the form of a personal computer 34) for controlling the operation and functions of the mass spectrometer 32. An example of a mass spectrometer suitable for use with the depicted system 20 as the mass spectrometer 32 is available from MDS SCIEX of Concord, Ontario, Canada, under the trade designation 4000 Qtrap. Although two separate computers 30 and 34 are utilized within the depicted system 20 for controlling the various operations of the system components (including the mass spectrometer 32), all of the operations performed within the system 20 can, in the interests of the present invention, be controlled with a single computer or, in the alternative, be controlled through an appropriate software component loaded within the mass spectrometer software package. In this latter example, a single software package would control the XYZ staging, the image analysis and the mass spectrometric detection.

It is a feature of the system 20 that it includes image analysis means, generally indicated 40, for controlling the spaced distance (i.e. the distance as measured along the indicated Z-coordinate axis) between the tip 26 of the probe 24 and the surface array 22. Within the depicted system 20, the image analysis means 40 includes a light source 42 supported adjacent the probe tip 26 for directing a beam of light toward the tip 26 so that a shadow of the probe tip 26 is cast over the surface of the array 22. In addition, a closed circuit camera 44 is supported to one side of the array 22 for collecting images of the probe tip 26 and the shadow cast upon the array by the probe tip 26 in preparation of and during a sample-collection operation, and a video (e.g. a black and white television) monitor 46 is connected to the camera 44 for receiving and displaying the images collected by the camera 44. The monitor 46 is, in turn, connected to the laptop computer 30 (by way of video capture device 50) for conducting signals to the computer 30 which correspond to the images taken by the camera 44. As will be explained in greater detail herein, it is these collected images which are used to determine the actual, real-time distance between the tip 26 of the probe 24 and the surface array 22.

Furthermore, the system 20 is provided with a webcam 48 having a lens which is directed generally toward the probe 24 and surface array 22 and which is connected to the laptop computer 30 for providing an operator with a wide-angle view of the probe 24 and the surface array 22. The images collected by the webcam 48 are viewable upon a display screen, indicated 52, associated with the laptop computer 30 by an operator to facilitate the initial positioning of the surface array 22 relative to the probe 24 in preparation of a sample-collection operation.

An example of a closed circuit camera suitable for use as the camera 44 is available from Panasonic Matsushita Electric Corporation under the trade designation Panasonic GP-KR222, and the camera 44 is provided with a zoom lens 45, such as is available from Thales Optem Inc. of Fairport, N.Y. under the trade designation Optem 70 XL. An example of a video capture device suitable for use as the video capture device 50 is available under the trade designation Belkin USB VideoBus II from Belkin Corp. of Compton, Calif., and an example of a webcam which is suitable for use as the webcam 48 is available under the trade designation Creative Notebook Webcam from W. Creative Labs Inc., of Milpitas, Calif.

The operation of the system 20 and its image analysis means 40 can be better understood through a description of the system operation wherein through its use of image analysis, the system 20 monitors the real-time measurement of the distance between the probe 24 and the surface array 22 to initiate formation of a liquid microjunction between the tip 26 of the sampling probe 24 and the surface array 22 to be sampled and thereafter initiates adjustments, as needed, to the actual probe-to-surface array distance by way of the laptop computer 30 and the XYZ stage 28 so that the optimum junction distance (as measured along the Z-axis) is maintained throughout a sampling process, even though the surface array 22 might be shifted along the X or Y coordinate axes for purposes of collecting a sample from other spots along the array 22 or from along different lanes across the array 22.

At the outset of a sample-collecting operation performed with the system 20, a desired probe-to-surface array distance which corresponds to the distance at which an optimum microjunction thickness is presented between the probe 24 and the surface array 22 for purposes of collecting a sample therefrom is preprogrammed into the memory 33 of the laptop computer 30. Optimum microjunction thicknesses vary between various materials (e.g. solution compositions) desired to be sampled, and the applicants have determined, empirically, the optimum microjunction thicknesses for a number of various materials desired to be sampled. Such optimum thicknesses may fall, for example, between 20 and 50 μm. By means of appropriate software, which has been developed by applicants and loaded within the computer 30, an operator can identify (from a computer-generated list of possible materials) the material comprising the surface array 22 to be sampled, and the computer 30 will automatically identify the optimum microjunction thickness for that material and the attending probe-to-surface array distance. As will be apparent herein, this pre-programmed attending probe-to-surface array distance provides a target distance at which the probe tip 26 and the surface array 22 are desired to be spaced, and during an image analysis process performed with the system 40, the actual, or real-time, probe-to-surface array distance is compared to the desired target probe-to-surface array distance corresponding to the optimum microjunction thickness for the surface array 22.

In preparation of an image analysis with the system 20, an operator enters appropriate positioning commands into the laptop computer 30 so that the XYZ stage 28 moves the surface array 22 along the Z-axis and toward the probe tip 26 until the surface array 22 is positioned in relatively close proximity to, although spaced from, the tip 26 of the probe 24. During this set-up stage, the relative position between the surface array 22 and the probe tip 26 can be visually monitored by the operator who watches the images obtained through the webcam 48 and displayed upon the laptop display screen 52 so that the array 22 is not brought too close to the probe tip 26. In other words, to reduce the risk that the array 22 is brought so close to the probe tip 26 that the probe-to-surface array distance is smaller than the target distance, the array 22 is not brought any closer to the probe tip 26 during this set-up stage than, for example, about 400 μm.

Once the surface array 22 is brought to within about 400 μm of the probe tip 26 during this set-up stage, the operator enters appropriate commands into the laptop computer 30 through the keyboard 31 thereof so that the XYZ stage 28 begins to move the surface array 22 closer to the probe tip 26 (along the Z-coordinate axis) while a light beam is directed from the light source 42 toward the probe 24 so that the shadow of the probe tip 26 is cast upon the surface array 22. As the array 22 is moved closer to the probe tip 26, continual images of the probe tip 26 and the surface array 22 and, more specifically, the shadow of the probe tip 26 cast thereon are captured, or taken, with the camera 44. Electrical signals corresponding to these captured images are immediately transmitted to the laptop computer 30 where an image analysis is performed upon selected ones of these images. In the interests of the present invention, the phrase "selected ones of the captured images" means the images captured at preselected and regularly-spaced intervals of time (e.g. every one-half second), and the time interval between these selected images for analysis can be preprogrammed into, or selected at, the laptop computer 30.

Along the same lines and from selected ones of the captured images, the laptop computer 30 is able to generate for each image, by way of a suitable program loaded within the computer 30, a plot of the average line brightness (LAB) of each image along the Z-axis. These LAB plots can thereafter be utilized to determine the real-time, or actual, spaced distance between the probe tip 26 and the surface array 22.

Figure 3A:
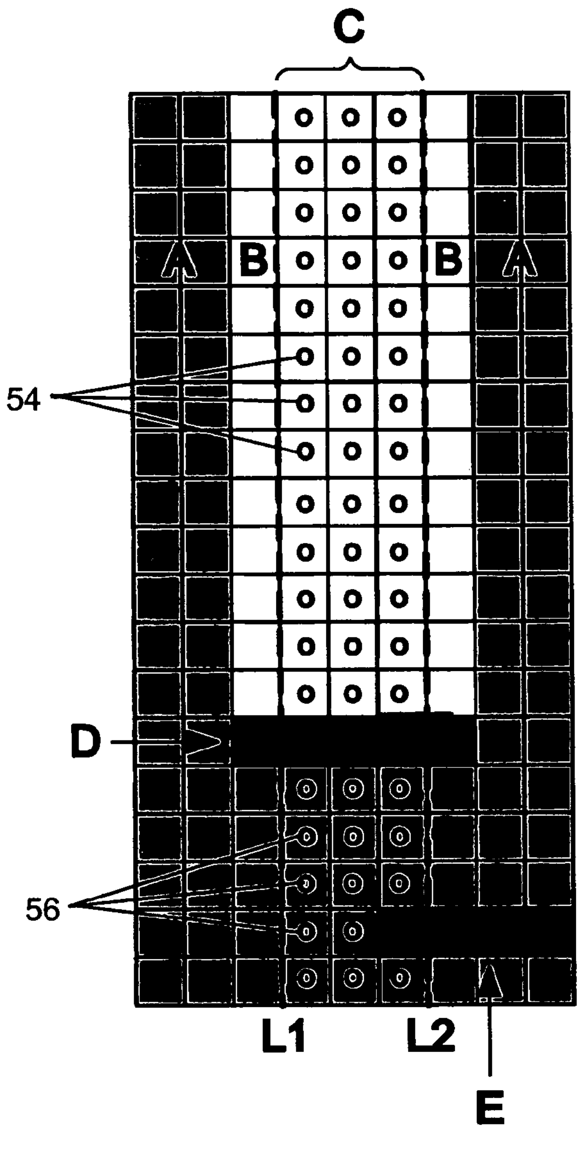
FIG. 3*a* is a schematic representation of a theoretical image with which the image analysis utilized during the method of the present invention can be explained.
Figure 3B:
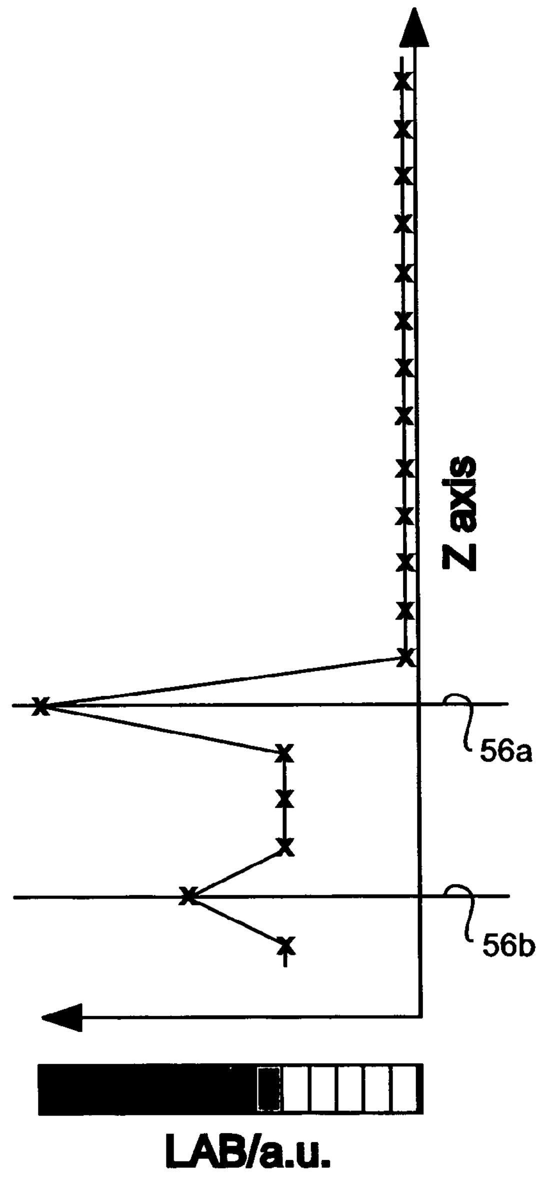
FIG. 3*b* is an attending plot of the line average brightness (LAB) along the Z-axis for the theoretical image of FIG. 3*a*.

By way of example, there is illustrated in FIG. 3*a* a schematic illustration of an exemplary 9-pixel wide and 19-pixel high captured image of the probe tip 26 and the surface array 22 to be sampled. Within the FIG. 3*a* image, the area indicated "A" is the background, the areas indicated "B" are the non-examined parts of the probe image, and the area, indicated "C" of the FIG. 3*a* image analyzed by the computer 30 lies between the two vertical lines L1 and L2. In addition, the areas indicated "D" is the liquid/probe interface. Through proper lighting from the light source 42 applied as an image of the probe tip 26 and surface array 22 is captured, the resultant images of the sampling probe 24 and the surface array 22 are brighter than is the image of the probe tip 26 at which the liquid material (e.g. the eluting solvent) protrudes slightly from the tip 26. The brightness of the pixels along the horizontal lines, indicated 56, which extend between lines L1 and L2 is summed by the computer 30 (e.g. three pixels in every line, marked by circles 54 in the FIG. 3*a* exemplary image.) This calculated (i.e. summed total) value represents the average brightness of the horizontal lines, and these line average brightness (LAB) values are plotted versus the Z-axis position (i.e. along the probe-to-surface array direction) to provide the graph illustrated in FIG. 3*b*.

As far as how the system 20 measures the brightness of any pixel in a captured image is concerned, it is noteworthy that image pixels can be comprised of red, green and blue components. The system 20 or, more particularly, the computer 30 identifies the intensity of each of the red, green and blue components and then adds the intensities of these components together to obtain a brightness value for use in the LAB analysis. If it is determined that a particular color of the surface array, such as the color green, disturbs the image analysis, appropriate filter algorithms can be applied within the software to calculate the intensity of a pixel (e.g. adding intensities of only the red and blue components together, but not that of the green, to obtain a brightness value for use in the LAB analysis in the current example) from the resultant image. In this latter case and with the green color removed from the pixels of the image being analyzed, the brightness could be defined as simply the sum of the intensity of the red component of the image and the intensity of the blue component. It also follows that many types of filtering or image manipulation can be performed within the computer 30, as desired, to enhance the image and thereby advantageously affect the results of the image analysis.

The plotted LABs are normalized relative to the brightness and the darkest LAB value in the examined range. It can be seen from the FIG. 3*a* image that the horizontal lines at which the lowest LABs are obtained (which lines are indicated 56*a* and 56*b* in FIG. 3*a*) correspond to the Z-axis location of the probe tip 26 and the Z-axis location of the shadow, indicated E, of the probe 24 upon the surface array 22. As will be apparent herein, it is the spaced-apart distance of these (two) horizontal lines 56*a* and 56*b* at which the lowest LABs are obtained that is used to calculate the actual spaced-apart distance between the probe 24 and the surface array 22. For example, if it is known that each image pixel present between the horizontal lines 56*a* and 56*b* corresponds to an actual spacing of 5 μm, then an image in which 3 pixels are present between the horizontal lines 56*a* and 56*b* would indicate that the probe 24 and surface array 22 are spaced apart by an actual distance of 15 μm. For such analysis purposes, the memory 33 of the laptop computer 30 is preprogrammed with information relating to the actual spaced-apart distance per pixel of the captured image.

Figures 4A, 4B, 4C, 4D:
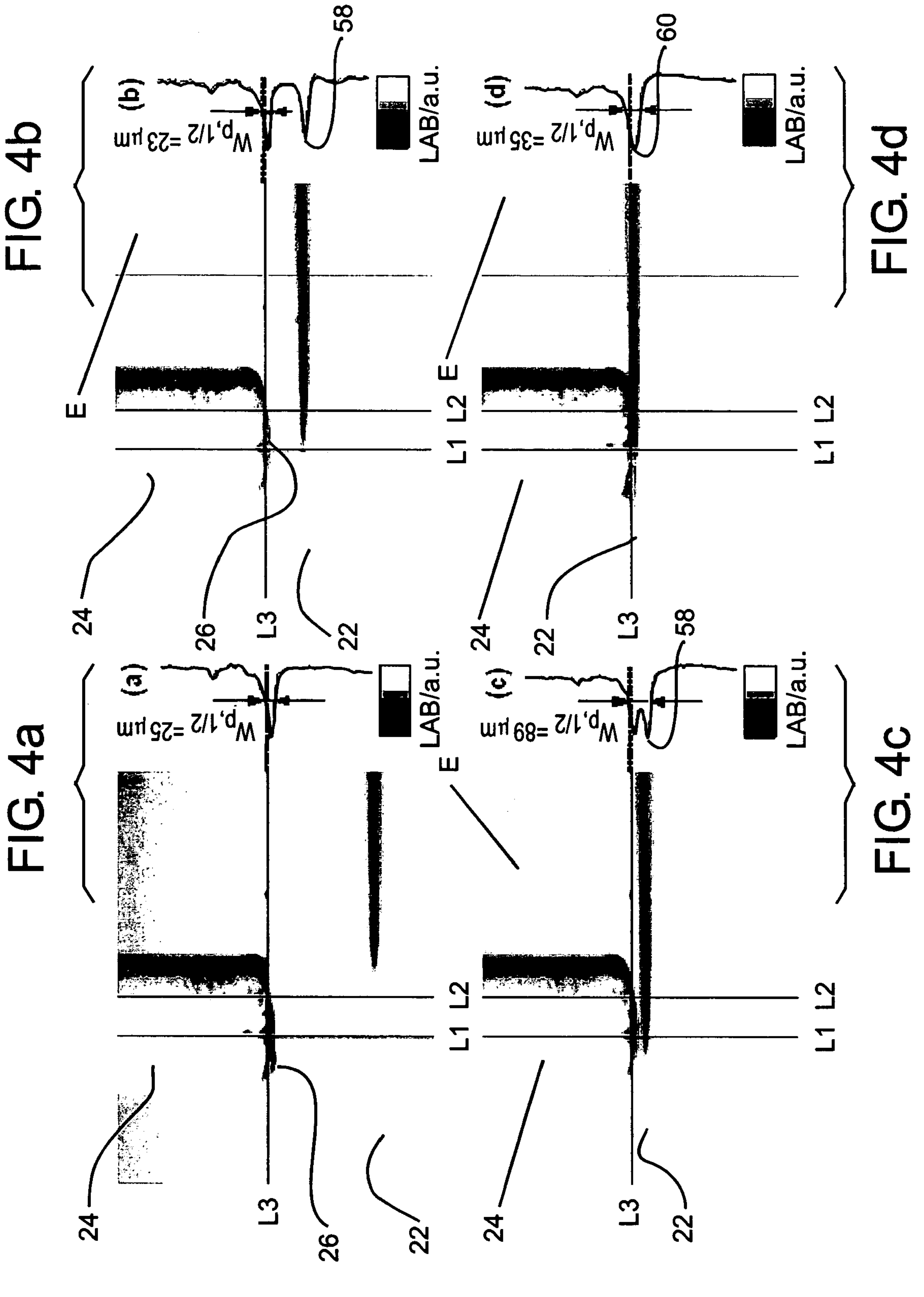
FIGS. 4*a*-4*d* are examples of actual captured images of the probe tip and the surface array of FIG. 1 as the probe tip and surface array are moved toward one another and attending plots of the line average brightness for each of the captured images.

With reference to FIGS. 4*a*-4*d*, there are illustrated examples of actual captured images of the surface array 22 as the array 22 approaches the probe tip 26 and corresponding LAB versus Z-axis position plots. The image illustrated in FIG. 4*a* shows the probe 24 disposed relatively distant (e.g. 200-400 μm) from the surface array 22 with the resulting Z-axis versus brightness plot indicating the image of only a single low-value LAB (i.e. a peak corresponding to the Z-axis location of the sampling probe tip 26). As the distance between the probe tip 26 and the surface array 22 decreases, the shadow E of the probe 24 enters the analyzed part of the image resulting in a second peak 58 on the brightness plot (as best seen in FIGS. 4*b* and 4*c*). By comparison, the image depicted in FIG. 4*d* shows the relative position between the probe 24 and the surface array 22 at which an optimum liquid microjunction is presented between the probe tip 26 and the surface array 22. More specifically, the Z-axis versus brightness plot of FIG. 4*d* exhibits only one, relatively wide peak, indicated 60, because there is no longer is a gap between the probe tip 26 and the surface array 22.

The aforediscussed image data presents two alternatives to automate formation of the liquid microjunction and to maintain the optimum junction thickness. The first alternative is to permit the surface array 22 to approach the probe 24 along the Z-axis until the two peaks which corresponding to the location of the probe tip 26 and the probe shadow E appear in the analyzed image and then to track the merging of the two peaks along the Z-coordinate axis. The calculation of the probe-to-surface distance in this first case would be based upon the separation and width of the two peaks. However, experiments conducted to date indicate that dark spots present upon the surface array 22 could interfere with the detection of the second peak (i.e. the peak corresponding with the Z-axis position of the probe shadow E), and when the smoothness of the surface array 22 is not uniform, the computer-determination of the second peak is not very reliable.

The second possibility to automate control of the liquid junction is to follow the full width of the first peak at half maximum (FWHM). With this approach, the FWHM is relatively constant as the surface array 22 approaches the probe 24, but experiences a sudden rise when the probe tip 26 and the surface shadow begin to merge followed by a linear decrease in the FWHM value when the merger is complete. This method is further improved by setting a line at the outset of the experiment that represented the edge of the probe tip 26 (e.g. line L3 in FIGS. 4*a*-4*d*). The distance between this set line L3 and the half peak width on the surface side of the Z-axis LAB peak (Wp, ½) is then monitored to determine the actual probe-to-surface array distance. This latter adjustment eliminates unreliable detection of the edge of the probe tip 26. Furthermore, successful long period automated surface sampling experiments prove that monitoring the distance between the set line (e.g. line L3) and the half peak width (Wp, ½) on the surface side of the Z-axis is a favorable approach to monitor the liquid junction thickness.

In an actual automated surface sampling experiment, there are four stages, with software variables for optimization of each, to form and maintain a stable liquid microjunction between the probe tip 26 and the surface array 22. In the first stage, the surface array 22 is moved closer to the probe tip 26 until the distance between the half peak width on the surface side of the Z-axis LAB peak (Wp, ½) reaches a preset value corresponding to the situation illustrated and described in FIG. 4*d*. In the second stage, the surface array 22 is forced to move (through the sending of appropriate commands from the computer 30 to the XYZ stage 28) some small distance closer to the probe 24 than the optimal thickness of the liquid junction (ca. 5 to 10 μm closer than optimum) to initiate the liquid junction formation. In the third stage, the surface array 22 is kept in a stationary condition for a few (usually about three) seconds to form a stable liquid junction and to permit initiation of the mass spectrometry data acquisition. In the fourth stage, the surface array 22 is moved (through the sending of appropriate commands from the computer 30 to the XYZ stage 28) away from (e.g. back from) the probe 24 to establish the predetermined optimal liquid microjunction thickness. This fourth stage is followed by continuous monitoring and adjustment of the probe-to-surface array distance between preset limits to obtain and maintain and optimal liquid junction during acquisition of the mass spectral data. Such preset limits correspond to a predetermined range within which the actual probe-to-surface array distance can be close enough (e.g. within ±3 μm) to the desired target probe-to-surface array distance that no additional movement of the surface array 22 toward or away from the probe 24 is necessary.

As far as the analysis of the collected samples are concerned, the samples collected from the surface array 22 through the probe 24 are conducted to the mass spectrometer 32 and are analyzed thereat in a manner known in the art. As mentioned earlier, the second control computer 34, having a display screen 38 and a keyboard 39 through which commands can be entered into the computer 34 for controlling the operation and data collection of the mass spectrometer 34.

It is common that during a sample-collection operation performed with the system 20, the surface array 22 is moved relative to the probe 24 within the X-Y plane so that the tip 26 of the probe 24 samples the surface array 22 as the surface array 22 sweeps beneath the probe 24. For this purpose and by way of example, the computer 30 can be pre-programmed to either index the surface array 22 within the X-Y plane so that alternative locations, or spots, can be positioned in vertical registry with the probe tip 26 for obtaining samples at the alternative locations or to move the surface array 22 along an X or Y coordinate axis so that the surface array 22 is sampled with the probe 22 along a selected lane across the surface array 22. In this latter example and upon completion of a single pass of the surface array 22 beneath the probe tip 26 along, for example, the X-axis, the surface array 22 can be indexed along the Y-axis by a prescribed, or preprogrammed amount, to shift an alternative X-coordinate lane into registry with the probe tip 26 for a subsequent pass of the surface array 22 beneath the tip 26 along the X-axis for continued sampling purposes. In experiments performed by applicants, samples were collected with the probe 24 at constant sweep, or scan, speeds of about 44 μm per second, but in the interests of the present invention, samples can be collected at alternative, or customized (i.e. varying) scan speeds.

Figure 5A:
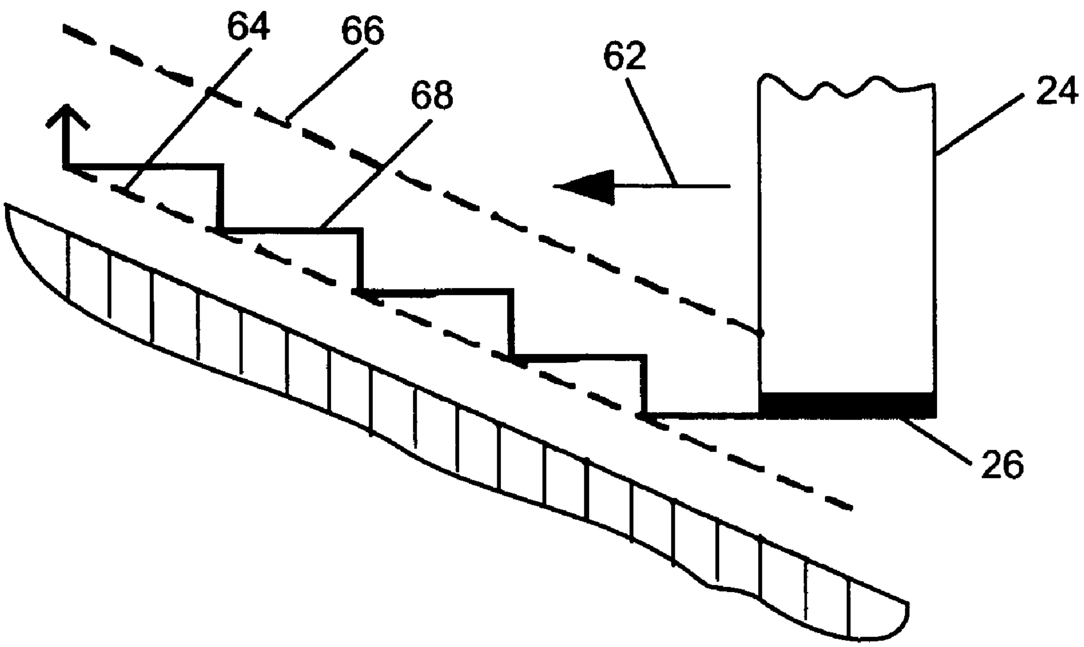
FIGS. 5*a* and 5*b* are views illustrating schematically the path of the tip of the probe relative to the surface array of FIG. 1 during a continuous re-optimization of the probe-to-surface array distance.
Figure 5B:
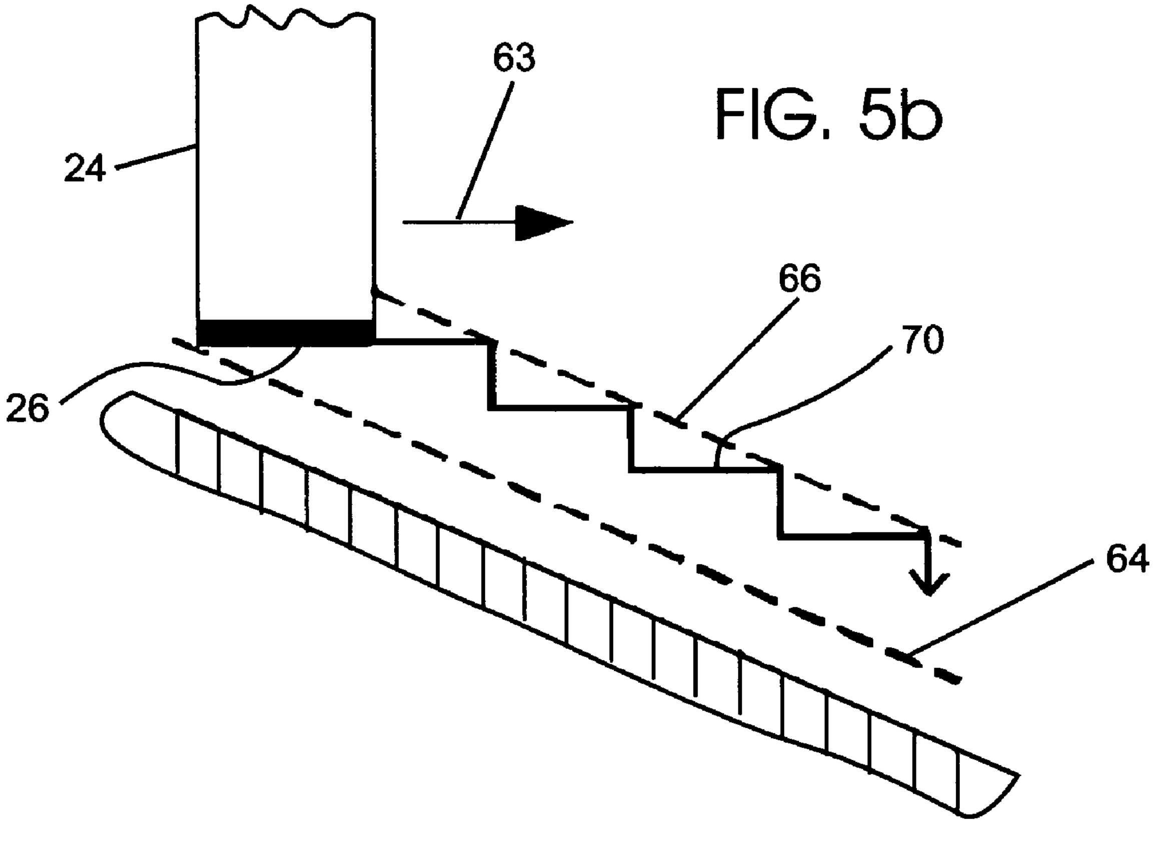

With reference to FIGS. 5*a* and 5*b*, there is schematically illustrated the positional relationship between the surface array 22 and the probe tip 26 as the surface array 22 is passed beneath the probe tip 26 during a sample-collection operation and the movement of the probe tip 26 during a re-optimization of the probe-to-surface array position. (Within both FIGS. 5*a* and 5*b*, the surface array 22 is depicted at an exaggerated angle with respect to the longitudinal axis of the probe 24 for illustrative purposes.) More specifically, within FIG. 5*a*, the surface array 22 and the probe 24 are moved relative to one another during a sample-collection process so that samples are collected from a lane of the surface array 22 in the negative (−) X-coordinate direction indicated by the arrow 62, and within FIG. 5*b*, the surface array 22 and the probe 24 are moved relative to one another during a sample-collection process so that samples are collected from a lane of the surface array 22 in the positive (+) X-coordinate direction indicated by the arrow 63.

Meanwhile, the dotted lines 64 and 66 depicted in FIGS. 5*a* and 5*b* indicate the outer boundaries, or preset limits, between which the probe tip 26 should be positioned in order that the optimum liquid microjunction is maintained between the surface array 22 and the probe tip 26. In other words and in order to maintain the spaced-apart distance between the probe 24 and the surface array 22 at a distance which corresponds to the distance at which the optimum liquid microjunction is presented between the surface array 22 and the probe tip 26, the probe tip 24 should not be moved closer to the surface array 22 (along the Z-axis) than is the line 64 nor should the probe tip 24 be moved further from the surface array 22 than is the line 66. In practice, the spaced-apart distance between the preset limits (as measured along the Z-axis) can be within a few microns, such as about 6 μm, from one another so that the preset limits (corresponding to the dotted lines 64 and 66) are each spaced at about 3 μm from the target distance at which the optimum liquid microjunction is presented between the probe tip 26 and the surface array 22. Accordingly and during a sample-collection operation performed with the system 20, images are captured at regularly-spaced intervals and, through the image analysis-techniques described above, the actual distance between the probe tip 26 and the surface array 22 is determined.

The determined actual distance is then compared, by means of appropriate software 70 running in the computer 30, to the desired target distance between the probe tip 26 and the surface array 22, which target distance is bounded by the prescribed limit lines 64 and 66. If the actual probe-to-surface array distance is determined to fall within the prescribed limit lines 64 and 66, no relative movement or adjustment of the surface array 22 and the probe tip 26 along the Z-axis is necessary. However, if the actual probe-to-surface array distance is determined to fall upon or outside of the prescribed limit lines 64 and 66, relative movement between or an adjustment of the relative position between the surface array 22 and the probe tip 26 is necessary to bring the actual probe-to-surface array distance back within the prescribed limits corresponding with the limit lines 64 and 66. Accordingly and during a sample-collection operation as depicted in FIG. 5*a* in which frequent adjustments of the surface array 22 and the probe 24 along the Z-axis must be made as the probe 24 is moved relative to the surface array 22 along the negative (−) X-coordinate axis, the path followed by the probe tip 26 relative to the surface array 26 can be depicted by the stepped path 68.

By comparison and during a sample-collection operation as depicted in FIG. 5*b* in which frequent adjustments of the surface array 22 and the probe 24 along the Z-axis must be made as the probe 24 is moved relative to the surface array 22 along the positive (+) coordinate axis, the path followed by the probe tip 26 relative to the surface array 26 can be depicted by the stepped path 69.

It follows from the foregoing that a system 20 and associated method has been described for controlling the probe-to-surface array distance during a surface sampling process involving electrospray-mass spectrometry (ES-MS) equipment. In this connection, the system 20 automates the formulation of real-time re-optimization of the sampling probe-to-surface liquid microjunction using image analysis. The image analysis includes the periodic capture of still images from a video camera 44 whose lens 45 is directed toward the region adjacent the tip 26 of the sampling probe 24 followed by analysis of the captured images to determine the actual sampling probe-to-surface array distance. By determining this actual probe-to-surface array distance and then comparing the actual probe-to-surface array distance to a target probe-to-surface array distance which corresponds to the probe-to-surface array distance at which the optimum liquid microjunction is presented between the probe tip 26 and the surface array 22, the system 20 can automatically formulate the optimal liquid microjunction between the probe tip 26 and the surface array 22 and continuously re-optimize the probe-to-surface array during the experiment by adjusting the spaced probe-to-surface distance, as necessary, along the Z-coordinate axis. If desired, the surface array 22 can be moved along the X-Y plane (and relative to the probe 24) to accommodate the automatic collection of samples with the probe 24 along multiple parallel lanes upon the surface array 22 with equal or customized spacing between the lanes. As mentioned earlier and although samples were collected from the surface array 22 during the aforediscussed experiments at constant scan speeds, samples can be collected in accordance with the broader aspects of the present invention at customized, or varying, scan speeds.

The principle advantages provided by the system 20 and associated method for controlling the probe-to-surface array distance throughout a sample-collection process relate to the obviation of any need for operation intervention and manual control of the probe-to-surface array distance (i.e. along the Z-coordinate axis) during a sample-collection process. Accordingly, the precision of a sample-collection operation conducted with the system 20 will not be limited by the skill of an operator required to monitor the sample-collection process.

Figure 6A:
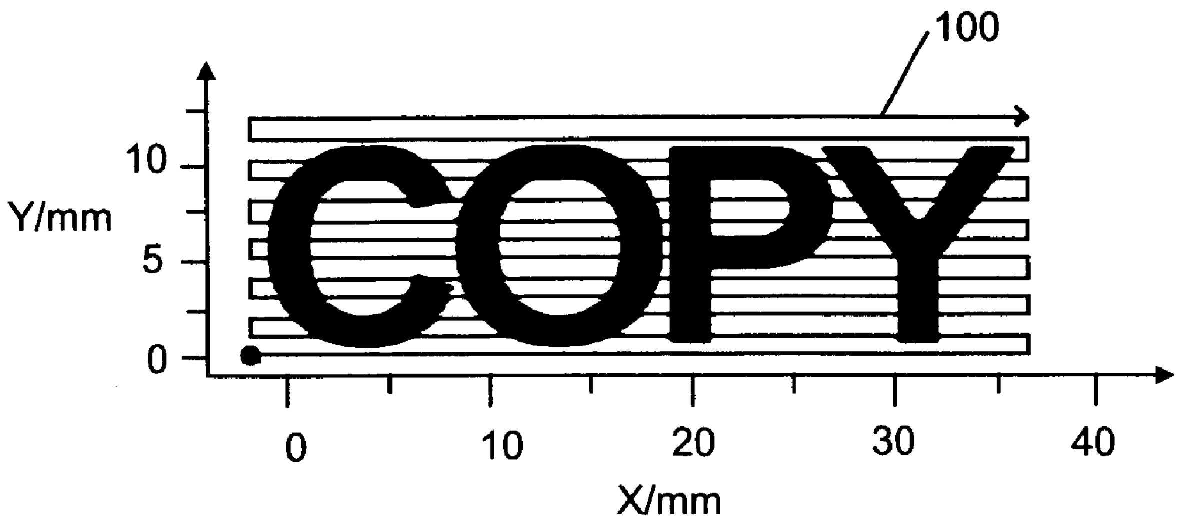
FIG. 6*a* is a view of the word "COPY" appearing on a piece of paper.
Figure 6B:
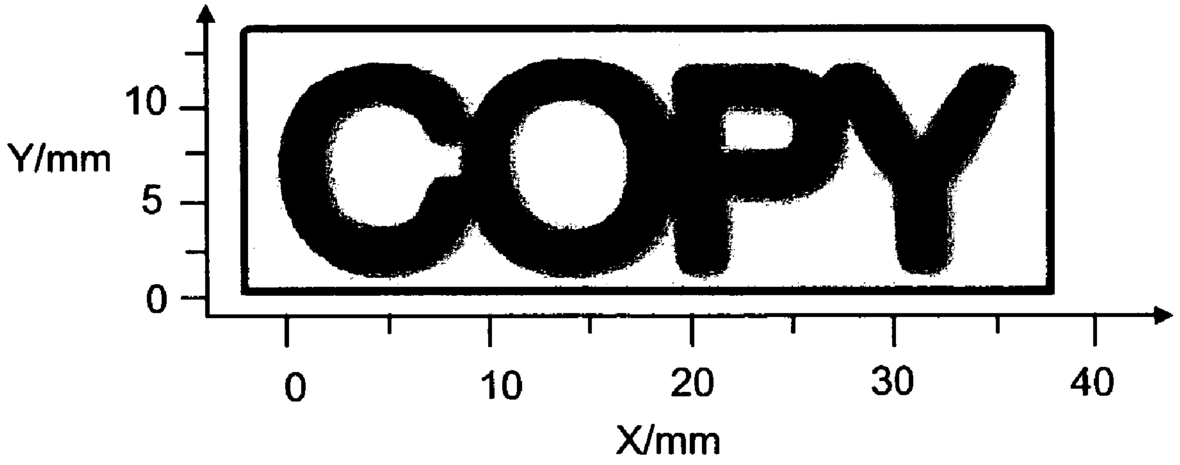

Applicants have also determined that the system and method described herein can be used for imaging applications, and such applications have been substantiated through experimentation. For example and with reference to FIGS. 6*a*-6*d*, applicants have transferred the word "COPY" to a sheet of tough paper using a stamp with red ink containing dye rhodamine B. The lettering of the FIGS. 6*a* image measured approximately 1.0 cm×3.7 cm, and the sampling path (comprised of a plurality of passes along the X-axis) across the FIG. 6*a* image is indicated 100. More specifically and within this experiment, thirteen passes were made across the FIG. 6*a* image, and the distance between adjacent passes was selected as 1.0 mm. The paper to which the word "COPY" was transferred for this experiment was affixed to a glass plate, and the glass plate was mounted upon the arm of the XYZ stage 28. As was the case with the TLC plate 27 described above, the surface of the paper was manually moved relative to the probe (i.e. along the Z-coordinate axis) to position the probe between about 300 to 400 μm above a desired X, Y coordinate starting point, and then the automated scan was begun at a speed of about 88 μm/second. FIGS. 6*b* and 6*c* are images of the lettering taken before and after, respectively, the surface sampling. The high efficiency of the sampling of the ink from the surface is indicated by the white tracks through the letters in FIG. 6*c*.

FIG. 6*d* shows the image of the inked letters based on a normalized mass spectrometric selective reaction monitoring detection (SRM) ion current profile along the thirteen scanned lanes. The darker areas in the image of FIG. 6*d* represents a higher SRM ion signal. There was a direct correlation between the photograph of the scanned letter (FIG. 6*c*) and the scanned image (FIG. 6*d*).

The data provided in FIG. 6*d* took ninety-four minutes to acquire. During this total time, the surface sampling system was under complete computer control; and no operator intervention was required. In addition, the FIG. 6*d* date also illustrates that the read-out resolution in these experiments was sufficient to create a readable image of the inked letters of the word "COPY". This resolution might not be suitable for other imaging applications (e.g. those employing smaller font lettering). With the current sampling probe (635 μm outer diameter), read-out resolution might be improved from a 1.0 mm-separated lane scan to about a 650 μm-separated lane scan. In addition, a smaller diameter probe could be used to further improve resolution by decreasing the necessary distance between lane scans. However, as the probe diameter shrinks, less material would be sampled from the surface and signal levels would be reduced.

It will be understood that numerous modifications and substitutions can be had to the aforedescribed embodiment without departing from the spirit of the invention. For example, although the aforedescribed embodiments have been shown and described wherein the probe 24 is supported in a fixed, stationary condition and the surface array 22 is moved relative to the probe 24 along either the X, Y or Z-coordinate directions to position a desired spot or development lane in registry with the probe tip 26, alternative embodiments in accordance with the broader aspects of the present invention can involve a surface array which is supported in a fixed, stationary condition and a probe which is moveable relative to the surface array along either the X, Y or Z coordinate directions. Accordingly, the aforedescribed embodiments are intended for the purpose of illustration and not as limitation.

The invention claimed is:

1. A sampling system for sampling a surface array having an analyte, the system comprising: a sampling probe having a tip and which is adapted to sample the surface array for analysis when disposed at a desired spaced distance from the surface array so that an optimum liquid microjunction is presented between the tip of the sampling probe and the surface array; means for moving the sampling probe and the surface array toward and away from one another; means for capturing a camera-generated image of both the tip of the probe and the surface array and for generating signals which correspond to the captured image; means for receiving the signals which correspond to the captured image and for determining the actual distance between the tip of the probe and the surface array from the captured image; comparison means for comparing the actual distance between the tip of the probe and the surface array to the desired target distance and for initiating the movement of the surface array and the probe tip toward or away from one another when the difference between the actual distance between the tip of the probe and the surface array and the desired distance is outside of a predetermined range so that by moving the surface array and the probe tip toward or away from one another, the actual target distance approaches the desired distance; and wherein the means for capturing the camera-generated image includes means for directing a light beam toward the probe tip so that a shadow of the probe tip is cast upon the surface array and so that the image captured by the image-capturing means surface includes both the probe tip and the shadow of the probe tip.

2. The system as defined in claim 1 wherein the surface array which is sampled with the probe is disposed substantially within an X-Y plane and is spaced from the probe along a Z-coordinate axis, and the means for moving the surface array and the probe toward and away from one another further includes means for moving the surface array relative to the probe within the X-Y plane so that any of a number of coordinate locations along the surface array can be positioned into registry with the tip of the probe for sampling purposes.

3. The system as defined in claim 1 wherein the means for determining the actual distance between the tip of the probe and the surface array utilizes at least one of the image-captured position of the probe tip and the shadow of the probe tip.

4. The system as defined in claim 3 wherein the means for determining is adapted to utilize line average brightness (LAB) techniques with the camera-generated image for determining the actual distance between the probe tip and the surface array.

5. In a surface sampling system for sampling a surface array for analysis wherein the system includes a sampling probe having a tip with which the surface array is sampled with the array and wherein there exists a desired target distance between the tip of the probe and the surface array at which an optimum liquid microjunction is presented between the probe tip and the surface array for sampling purposes, the improvement comprising: a computer containing information relating to the desired target distance between the tip of the probe and the surface array at which the optimum liquid microjunction is presented between the probe tip and the surface array for sampling purposes; means connected to the computer for moving the surface array and the tip of the probe toward and away from one another in response to commands received from the computer; means for capturing a camera-generated image of both the tip of the probe and the surface array and for sending signals to the computer which correspond to the captured image; the computer includes means for receiving the signals which correspond to the captured image and for determining the actual distance between the tip of the probe and the surface array from the captured image; wherein the computer further includes comparison means for comparing the actual distance between the tip of the probe and the surface array and the target distance and for initiating the movement of the surface array and the probe tip toward or away from one another so that the actual distance approaches the target distance when the actual distance between the tip of the probe and the surface array is outside of a predetermined range; and wherein the means for capturing the camera-generated image includes means for directing a light beam toward the probe tip so that a shadow of the probe tip is cast upon the surface array and so that the image captured by the image-capturing means surface includes both the probe tip and the shadow of the probe tip.

6. The improvement as defined in claim 5 wherein the surface array is disposed substantially within an X-Y plane and is spaced from the probe along a Z-coordinate axis, and the means for moving the surface array and the probe toward and away from one another further includes means for moving the surface array relative to the probe within the X-Y plane so that any of a number of coordinate locations along the surface array can be positioned into registry with the tip of the probe for sampling purposes.

7. The improvement as defined in claim 5 wherein the means for determining the actual distance between the tip of the probe and the surface array utilizes at least one of the image-captured position of the probe tip and the shadow of the probe tip.

8. The improvement as defined in claim 7 wherein the means for determining is adapted to utilize line average brightness (LAB) techniques to the camera-generated image for determining the actual distance between the probe tip and the surface array.

9. A method for sampling a surface array containing an analyte, the method comprising the steps of: providing a sampling probe having a tip and which is adapted to sample a surface array for analysis when the tip of the probe is disposed at a desired spaced target distance from the surface array so that an optimum liquid microjunction is presented between the tip of the sampling probe and the surface array; supporting the probe and the surface array relative to one another to permit movement of the sampling probe and the surface array toward and away from one another; capturing a camera-generated image of both the tip of the probe and the surface array; determining the actual distance between the tip of the probe and the surface array from the captured image; comparing the actual distance between the tip of the probe and the surface array to the desired target distance and initiating the movement of the surface array and the probe tip toward or away from one another when the difference between the actual distance between the tip of the probe and the surface array and the desired target distance is outside of a predetermined range so that by moving the surface array and the probe tip toward or away from one another, the actual distance approaches the desired target distance; and wherein the step of capturing the camera-generated image includes the step of directing a light beam toward the probe tip so that a shadow of the probe tip is cast upon the surface array and so that the image captured during the image-capturing means step includes both the probe tip and the shadow of the probe tip.

10. The method as defined in claim 9 wherein the step of determining the actual distance between the tip of the probe and the surface array utilizes at least one of the image-captured position of the probe and the shadow of the probe tip.

11. The system as defined in claim 10 wherein the step of determining applies line average brightness (LAB) techniques to the camera-generated image for determining the actual distance between the probe tip and the surface array.

12. In a method for sampling a surface array for analysis wherein the method involves the use of a sampling probe having a tip with which the surface array is sampled and wherein there exists a desired spaced target distance between the tip of the probe and the surface array at which an optimum liquid microjunction is presented between the probe tip and the surface array for sampling purposes, the improvement comprising the steps of: capturing a camera-generated image of both the tip of the probe and the surface array; determining the actual distance between the tip of the probe and the surface array from the captured image; comparing the actual distance between the tip of the probe and the surface array and the desired target distance at which the optimum liquid microjunction is presented between the probe tip and the surface array for sampling purposes; moving the surface array and the probe tip toward or away from one another when the actual distance between the tip of the probe and the surface array and the desired target distance is outside of a predetermined range so that the actual distance approaches the target distance; and wherein the step of capturing an image includes the step of directing a light beam toward the probe tip so that a shadow of the probe tip is cast upon the surface array and so that the image captured during the image-capturing step includes both the probe tip and the shadow of the probe tip.

13. The improvement as defined in claim 12 wherein the steps of capturing, determining, comparing and moving are repeated, as needed, until the actual distance between the probe tip and the surface array is within a predetermined range of the target distance.

14. The improvement as defined in claim 12 wherein the steps of capturing, determining, comparing and moving are carried out during a sampling process involving the movement of the surface array and the probe tip relative to one another so that alternative locations of the surface array are positioned in registry with the probe tip and so that during the sampling process, the actual distance between the probe tip and the surface array is maintained within a predetermined range of the target distance.

15. The improvement as defined in claim 12 wherein the step of determining utilizes at least one of the image-captured positions of the probe and the shadow of the probe tip.

16. The improvement as defined in claim 15 wherein the means for determining applies line average brightness (LAB) techniques to the camera-generated image for determining the actual distance between the probe tip and the surface array.

17. A method for sampling a surface array containing an analyte, the method comprising the steps of:

providing a sampling probe having a tip and which is adapted to sample a surface array for analysis when the tip of the probe is disposed at a desired spaced target distance from the surface array so that an optimum liquid microjunction is presented between the tip of the sampling probe and the surface array;

supporting the probe and the surface array relative to one another to permit movement of the sampling probe and the surface array toward and away from one another;

capturing an image of both the tip of the probe and the surface array;

determining the actual distance between the tip of the probe and the surface array from the captured image;

moving the surface array and the tip of the probe relative to one another to one condition at which the actual distance between the tip of the probe and the surface array is slightly smaller than the desired target distance;

maintaining the probe tip and the surface array in a stationary relationship with respect to one another at said one condition for a predetermined period of time;

then moving the surface array and the probe tip away from one another;

comparing the actual distance between the tip of the probe and the surface array to the desired target distance; and discontinuing the movement of the surface array and the probe tip away from one another when the actual distance between the surface array and the probe tip is within a predetermined range of the target distance.

18. The method as defined in claim 17 wherein the step of moving the surface array and the probe tip so that the actual distance between the surface array and the probe tip is within a predetermined range of the target distance is followed by the steps of moving the surface array and the probe relative to one another to bring alternative locations of the surface array into registry with the probe tip for sampling purposes; and maintaining the surface array and the probe tip within a predetermined range of the target distance as the step of capturing is repeated to capture additional images of the tip of the probe and the surface array, the step of determining is carried out upon the additional images for determining the actual distance between the surface array and the probe tip for each of the additional images, and the step of comparing is repeated to compare the actual distance determined for each of the additional images with the target distance; and moving the surface array and probe relative to one another to bring the actual distance between the surface array and the probe tip closer to the target distance when the actual distance is ever determined during the comparing step to be outside of a predetermined range of the target distance.

* * * * *